US 11,449,098 B2

(12) United States Patent
Jo et al.

(10) Patent No.: US 11,449,098 B2
(45) Date of Patent: *Sep. 20, 2022

(54) MOBILE TERMINAL INCLUDING FLEXIBLE DISPLAY

(71) Applicant: LG ELECTRONICS INC., Seoul (KR)

(72) Inventors: Junghyun Jo, Seoul (KR); Insu Song, Seoul (KR); Hoseok Chung, Seoul (KR); Minsoo Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/953,622

(22) Filed: Nov. 20, 2020

(65) Prior Publication Data

US 2021/0208629 A1 Jul. 8, 2021

Related U.S. Application Data

(63) Continuation of application No. 16/853,568, filed on Apr. 20, 2020, now Pat. No. 10,871,797.

(30) Foreign Application Priority Data

Jan. 6, 2020 (WO) ................ PCT/KR2020/000198

(51) Int. Cl.
*G06F 1/16* (2006.01)
*H05K 5/03* (2006.01)
(Continued)

(52) U.S. Cl.
CPC .......... *G06F 1/1624* (2013.01); *G06F 1/1652* (2013.01); *H05K 5/03* (2013.01);
(Continued)

(58) Field of Classification Search
CPC .. H04M 1/0268; G06F 1/1624; G06F 1/1652; G09F 9/301; H05K 5/03; H05K 7/183
See application file for complete search history.

(56) References Cited

U.S. PATENT DOCUMENTS

2011/0176260 A1 7/2011 Walters et al.
2014/0211399 A1 7/2014 O'Brien
(Continued)

FOREIGN PATENT DOCUMENTS

CN 108259649 7/2018
KR 1020160031363 3/2016
KR 1020190143029 12/2019

OTHER PUBLICATIONS

U.S. Appl. No. 16/853,568, Office Action dated May 20, 2020, 13 pages.
(Continued)

*Primary Examiner* — James Wu
(74) *Attorney, Agent, or Firm* — Lee Hong Degerman Kang & Waimey

(57) ABSTRACT

A mobile terminal includes a first frame, a second frame movable from the first frame in a first direction, a third frame movable in the first direction with respect to the second frame, a flexible display including a first region coupled to the first frame, a second region coupled to the third frame, and a third region bendably disposed between the first region and the second region, and a display frame bendably coupled to a rear surface of the third region. The second frame includes a side portion positioned facing in a third direction perpendicular to the first direction and a guide rail formed on the side portion. The display frame has a guide hook inserted into the guide rail. Even when the display is extended, the mobile terminal keeps the display flat such that the display unit is prevented from being separated or sagged from the frame.

12 Claims, 9 Drawing Sheets

(51) Int. Cl.
*H05K 7/18* (2006.01)
*G09F 9/30* (2006.01)
*H04M 1/02* (2006.01)

(52) U.S. Cl.
CPC ............ *H05K 7/183* (2013.01); *G09F 9/301* (2013.01); *H04M 1/0268* (2013.01)

(56) References Cited

U.S. PATENT DOCUMENTS

| | | |
|---|---|---|
| 2016/0081204 A1 | 3/2016 | Park et al. |
| 2019/0261519 A1* | 8/2019 | Park .................... H05K 1/118 |
| 2019/0268455 A1 | 8/2019 | Baek et al. |
| 2019/0317550 A1 | 10/2019 | Kim et al. |
| 2019/0346954 A1 | 11/2019 | Jung et al. |

OTHER PUBLICATIONS

European Patent Office Application Serial No. 20165787.1, Search Report dated Sep. 14, 2020, 11 pages.

PCT International Application No. PCT/KR2020/000198, Notification of Transmittal of The International Search Report and the Written Opinion of the International Searching Authority, or Declaration dated Sep. 29, 2020, 9 pages.

* cited by examiner

FIG. 3
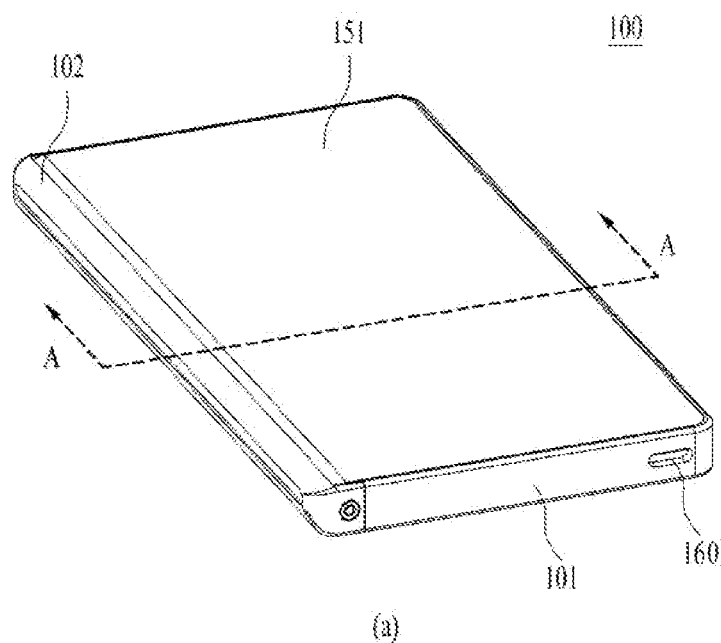
(a)
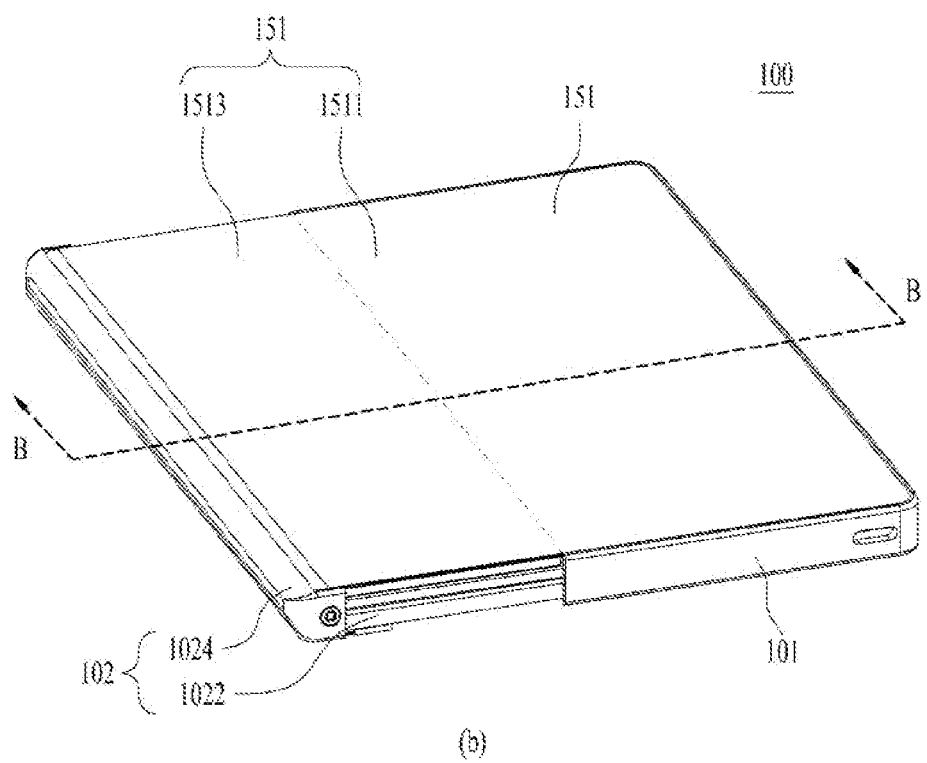
(b)

FIG. 4
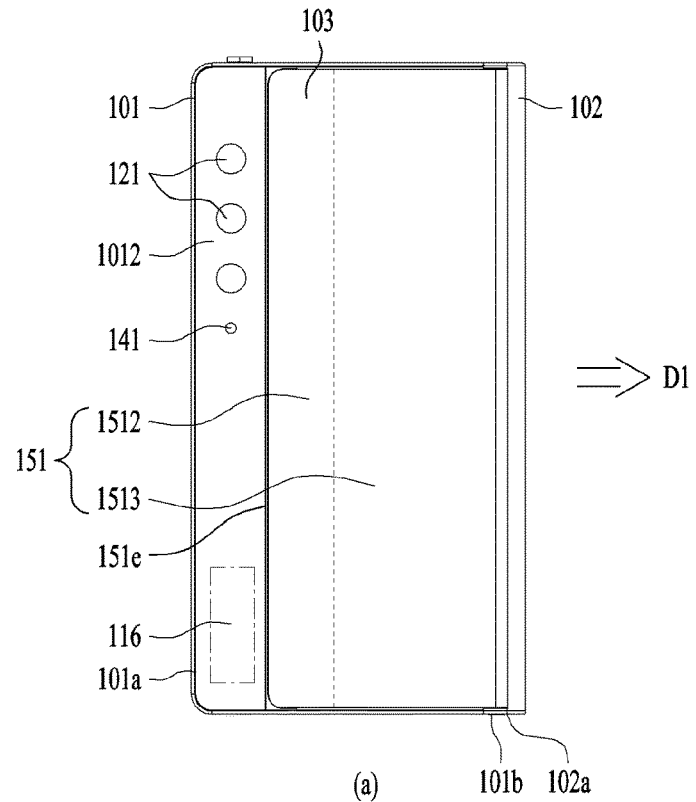
(a)
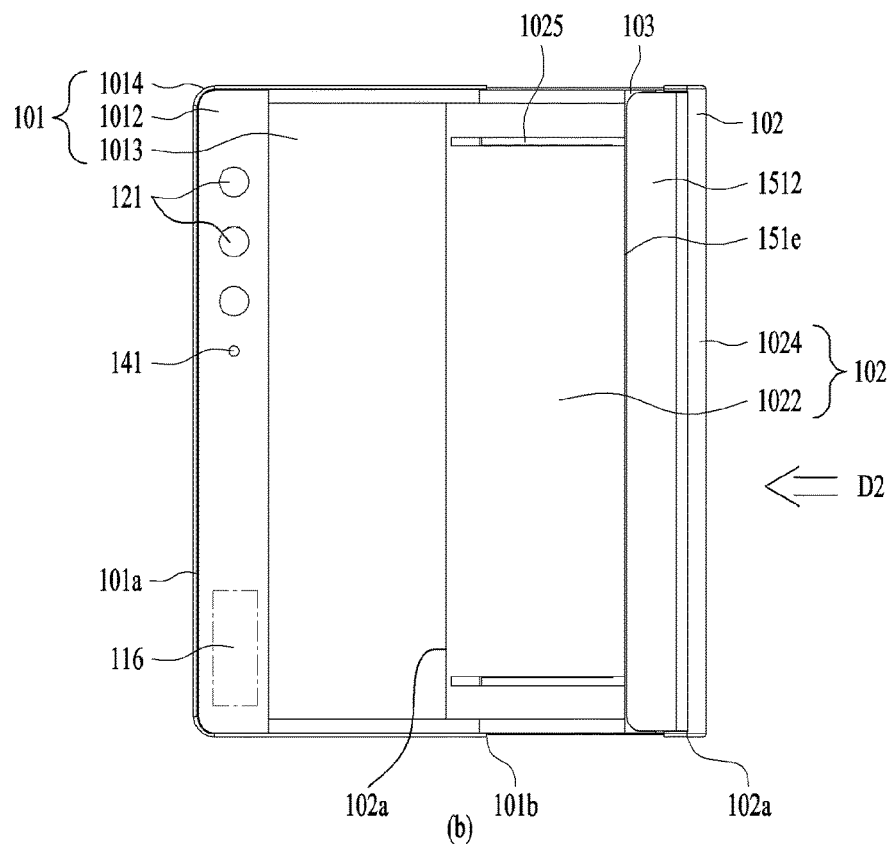
(b)

(a)  (b)

FIG. 6
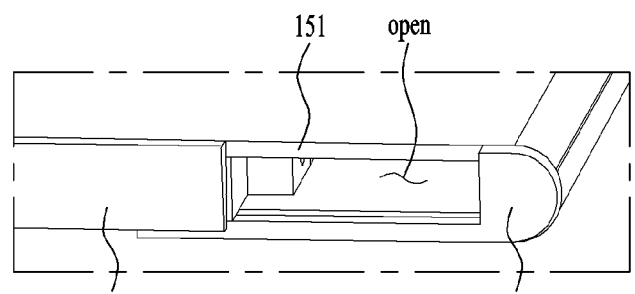
(a)
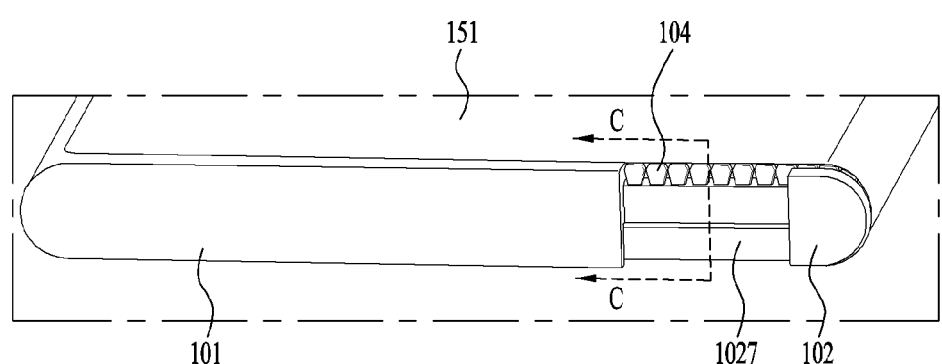
(b)

FIG. 9
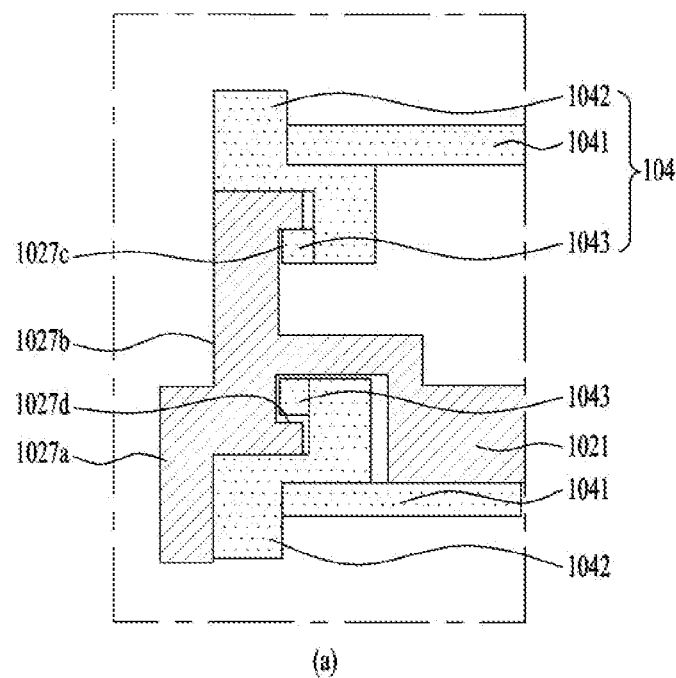
(a)
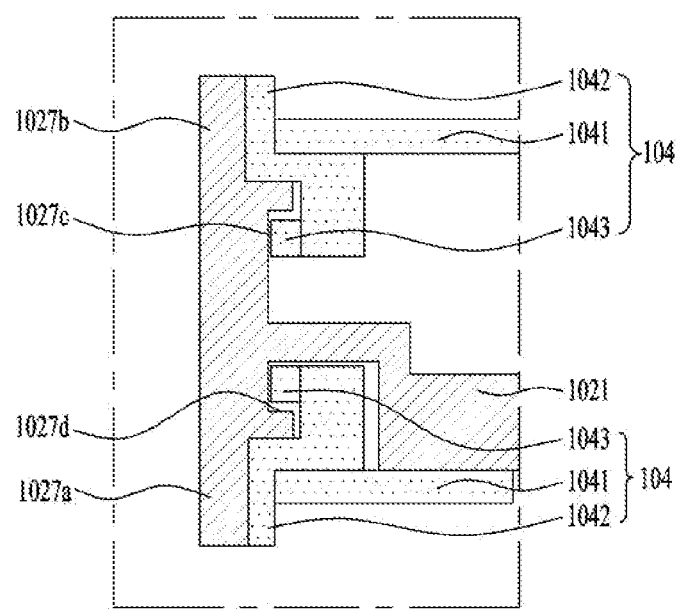
(b)

MOBILE TERMINAL INCLUDING FLEXIBLE DISPLAY

CROSS-REFERENCE TO RELATED APPLICATIONS

This application is a continuation of U.S. patent application Ser. No. 16/853,568, filed on Apr. 20, 2020, which claims the benefit of earlier filing date and right of priority to International Application No. PCT/KR2020/000198, filed on Jan. 6, 2020, the contents of which are hereby incorporated by reference herein in its entirety.

BACKGROUND

Field

The present disclosure relates to a mobile terminal that has a flexible display and is variable in size.

Discussion of the Related Art

Terminals may be generally classified as mobile/portable terminals or stationary terminals according to their mobility. Mobile terminals may also be classified as handheld terminals or vehicle mounted terminals according to whether or not a user can directly carry the terminal.

A display device is a device equipped with functions of receiving, processing and displaying user-viewable images. The display device, for example, receives broadcasting selected by a user from broadcast signals broadcasted by a broadcasting station, splits video signals from the received signals, and displays the split video signals on a display.

Recently, owing to the developments of broadcast and network technologies, functions of a display device have been considerably diversified and performance of the device has been improved correspondingly. Namely, the display device has been developed so as to provide a user with various contents as well as simply broadcasted contents. For example, the display device can provide game play, listening to music, Internet shopping, user-customized information and the like using various applications as well as programs received from broadcasting stations. In order to perform such extended functions, the display device is basically connected to other devices or a network using various communication protocols and is able to provide ubiquitous computing environments to a user. Namely, the display device has been evolved into a smart device that enables connectivity to a network and ubiquitous computing.

In recent years, a flexible display capable of large deformation with sufficient elasticity has been developed. Such deformability of the flexible display may enable a mobile terminal to be variable in size. For a mobile terminal having a variable structure as described above, variation of the structure of the mobile terminal is required to be stable, and the support structure of the variable display may raise an issue.

SUMMARY OF THE DISCLOSURE

An object of the present disclosure is to provide a mobile terminal including a display frame that is capable of covering an inner portion exposed when the mobile terminal is extended and preventing separation of the display unit.

To achieve these objects and other advantages and in accordance with the purpose of the disclosure, as embodied and broadly described herein, a mobile terminal may include a first frame, a second frame configured to move from the first frame in a first direction to switch from a first state to a second state and to slidably move in the second state in a second direction to switch to the first state, the second direction being opposite to the first direction, a third frame configured to move in the first direction or the second direction with respect to the second frame, a flexible display comprising a first region coupled to the first frame, a second region coupled to the third frame, and a third region disposed between the first region and the second region, the third region being bent in a manner of surrounding the second frame, and a display frame bendably coupled to a rear surface of the third region of the display, wherein the second frame comprises a side portion positioned at an end thereof facing in a third direction perpendicular to the first direction and a guide rail formed on the side portion, wherein the display frame is provided with a guide hook at an end thereof, the guide hook being inserted into the guide rail.

The guide rail may be formed symmetrically on front and rear sides of the mobile terminal.

The side portion of the second frame may include a rear side portion configured to cover an end of the display frame positioned on a rear side, the end facing in the third direction.

The side portion of the second frame may include a front side portion arranged in front of the rear side portion and positioned deeper than the rear side portion to form a step.

The front side portion may include an opening formed to expose the end of the display frame facing in the third direction for the display frame positioned on a front side.

The end of the display frame and the front side portion may be in the same plane.

The display frame may include a plurality of support bars extending in the third direction and arranged side by side in the first direction, wherein an inner side of a cross section of each of the support bars may be shorter than an outer side of the cross section.

The display frame may further include an extended end extending from an end of each of the support bars to surround a side surface of the display positioned in front of the support bars.

The extended ends may extend toward the neighboring support bars, wherein a spacing between the neighboring extended ends may be narrower than a spacing between the neighboring support bars.

The mobile terminal according to the present disclosure may protect the interior of the mobile terminal by covering the lateral side of an extended portion thereof when the mobile terminal is switched to a second state.

In addition, the mobile terminal may support an extended flexible display unit, thereby improving usability even when it is extended.

Even when the display unit of the mobile terminal is extended, a guide structure may keep the display unit flat such that the display unit is not separated or sags from the frame.

Further scope of applicability of the present disclosure will become apparent from the detailed description given hereinafter. However, it should be understood that the detailed description and specific examples, while indicating preferred embodiments of the disclosure, are given by illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings, which are given by illustration only, and thus are not limitative of the present disclosure, and wherein:

FIG. 3 is a perspective view illustrating a first state and a second state of a mobile terminal;

FIG. 4 is a rear view illustrating a first state and a second state of a mobile terminal;

FIG. 6 is a perspective view showing a side portion of an embodiment according to presence of the side portion of a second frame;

FIG. 9 is a view taken along line C-C of FIG. 6.

DETAILED DESCRIPTION OF THE DISCLOSURE

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element may be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Figure 1:
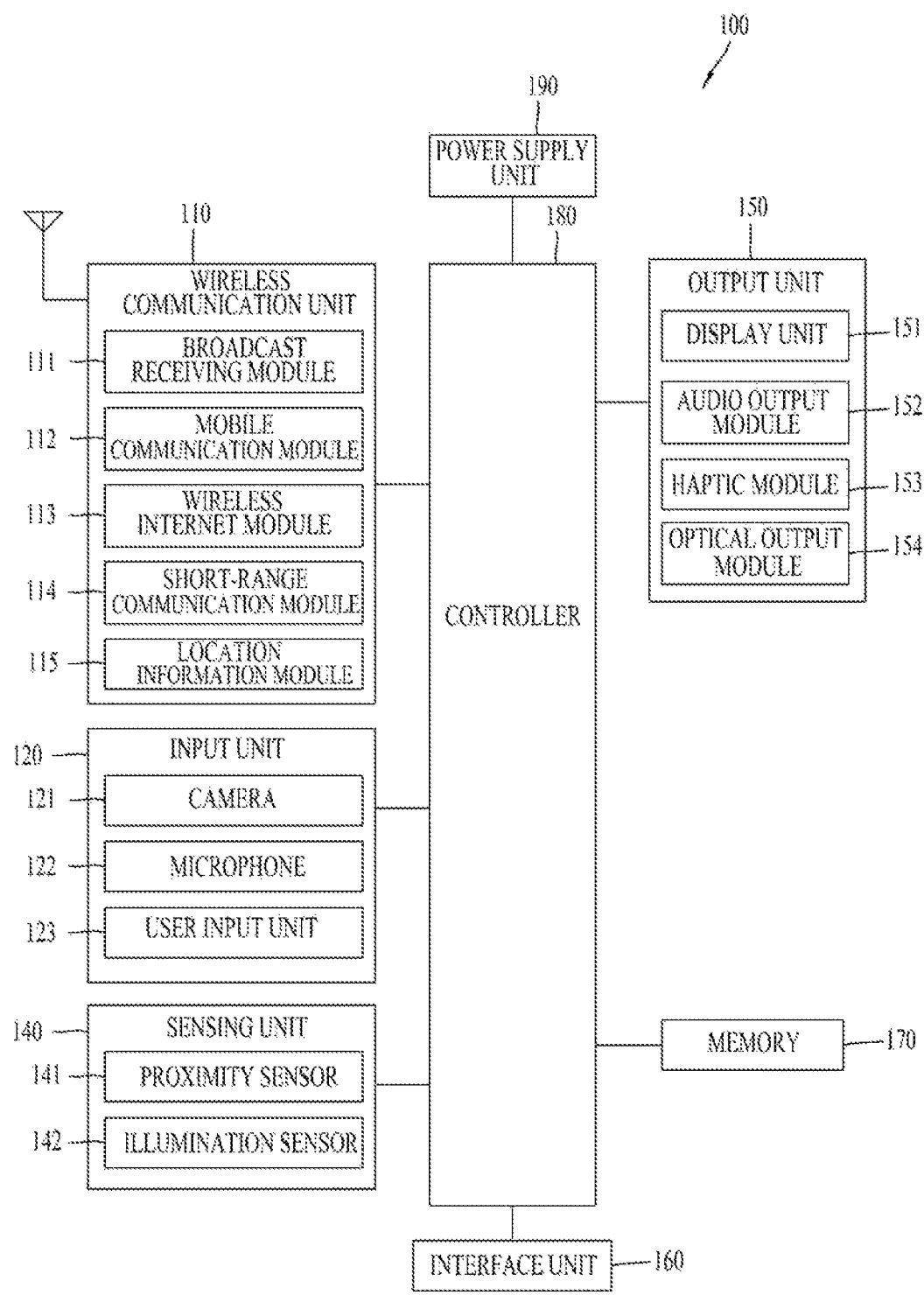
FIG. 1 is a block diagram of a mobile terminal in accordance with the present disclosure.

FIG. 1 is a block diagram of a mobile terminal in accordance with the present disclosure.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components in FIG. 1 is not a requirement, and that greater or fewer components may alternatively be implemented.

More specifically, the wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 may transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal. As one example, when the mobile terminal uses a GPS module, a position of the mobile terminal may be acquired using a signal sent from a GPS satellite. As another example, when the mobile terminal uses the Wi-Fi module, a position of the mobile terminal may be acquired based on information related to a wireless access point (AP) which transmits or receives a wireless signal to or from the Wi-Fi module.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

Cameras 121 may process image frames of still pictures or video obtained by image sensors in a video or image capture mode. The processed image frames may be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input may be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the controller 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is typically implemented using one or more sensors configured to sense internal information of the mobile terminal, the surrounding environment of the mobile terminal, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 may provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 may be configured to generate various tactile effects that a user feels, perceive, or otherwise experience. A typical example of a tactile effect generated by the haptic module 153 is vibration. The strength, pattern and the like of the vibration generated by the haptic module 153 may be controlled by user selection or setting by the controller. For example, the haptic module 153 may output different vibrations in a combining manner or a sequential manner.

An optical output module 154 may output a signal for indicating an event generation using light of a light source. Examples of events generated in the mobile terminal 100 may include message reception, call signal reception, a missed call, an alarm, a schedule notice, an email reception, information reception through an application, and the like.

The interface unit 160 serves as an interface with various types of external devices that may be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1. Moreover, the controller 180 may be implemented to combinedly operate two or more of the components provided in the mobile terminal 100 to drive the application programs.

The power supply unit 190 may be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170.

Figure 2:
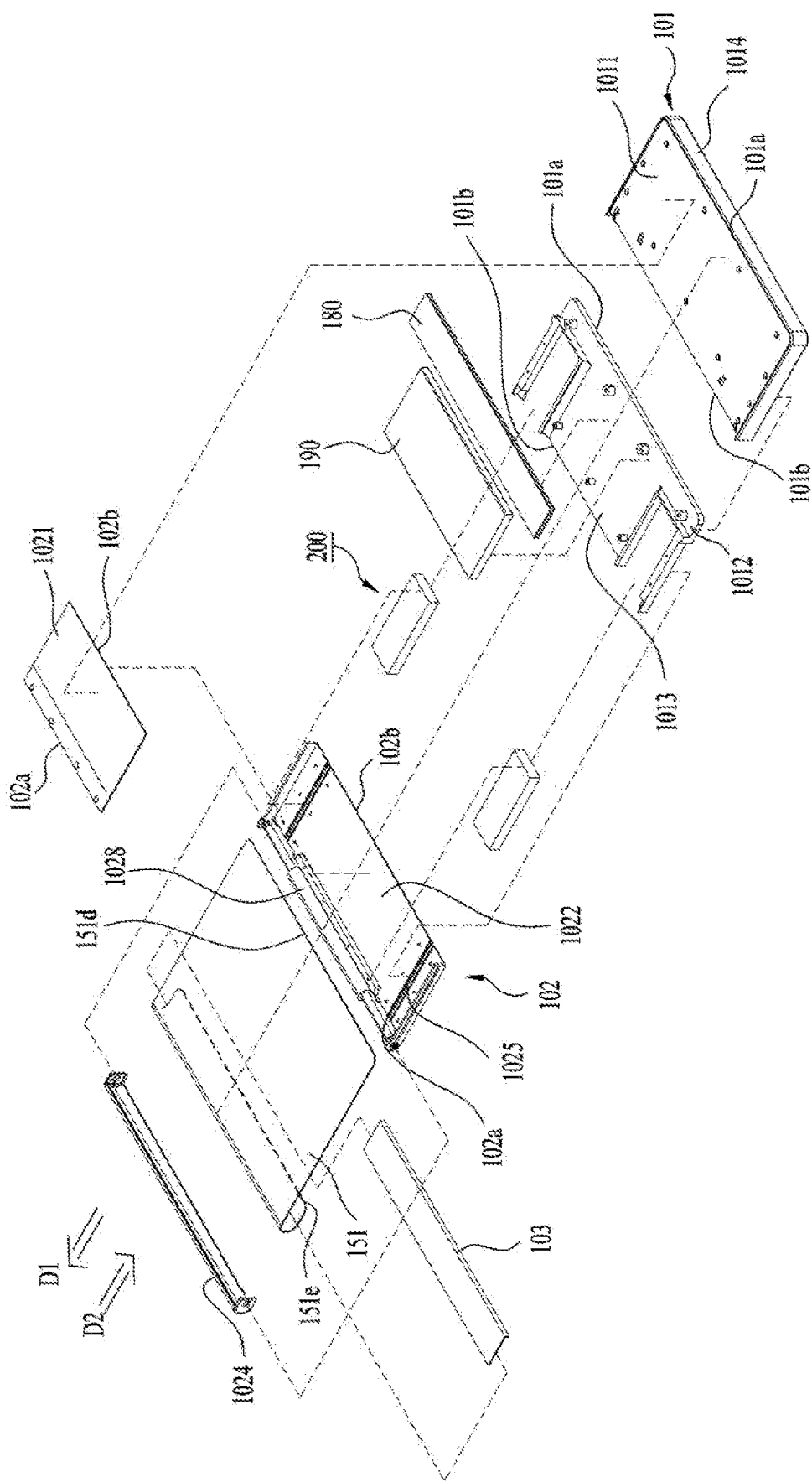
FIG. 2 is a exploded perspective view of a mobile terminal.
Figure 5:
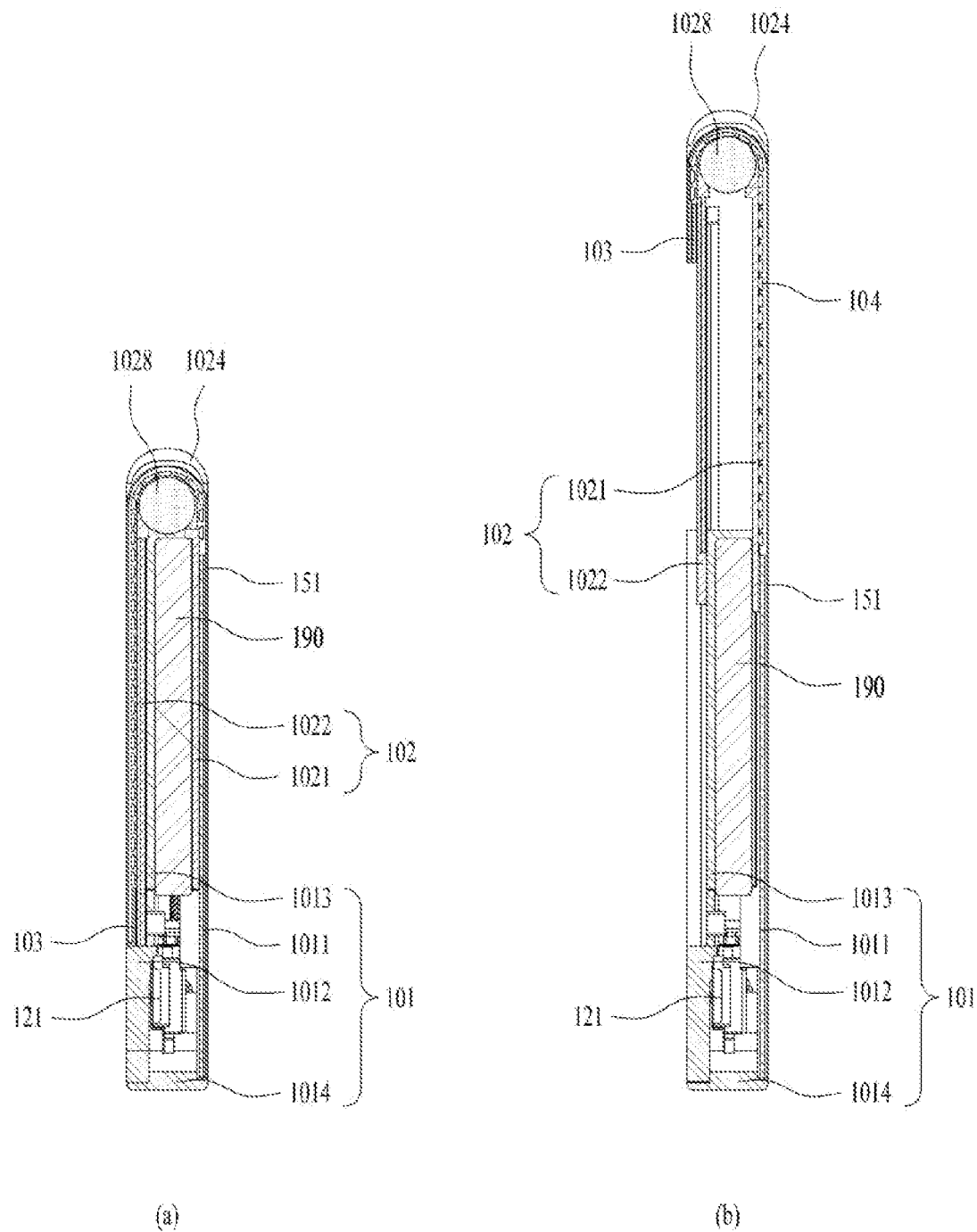
FIG. 5 is a cross-sectional view taken along lines A-A and B-B of FIG. 3.

FIG. 2 is a exploded perspective view of a mobile terminal according to the present disclosure. FIG. 3 is a perspective view illustrating a first state and a second state of the mobile terminal viewed from one side, and FIG. 4 is a rear view illustrating the first state and second state of the mobile terminal. FIG. 5 is a cross-sectional view taken along lines A-A and B-B of FIG. 3. Specifically, FIGS. 3(a), 4(a) and 5(a) show the first state of the mobile terminal, and FIGS. 3(b), 4(b) and 5(b) show the second state of the mobile terminal.

As shown in the figures, a mobile terminal 100 in the first state is retracted to have a smaller size than in the second state. In the first state, the size of the display unit 151, which is arranged on the front of the mobile terminal 100, is also smaller than in the second state. On the other hand, when the mobile terminal 100 in the first state is extended in a first direction D1, it may switch to the second state. In the second state, the size of the mobile terminal 100 and the size of the front portion of the display unit 151 are larger than those in the first state. In the following description, the direction in which the mobile terminal 100 and the display unit 151 thereof are extended or enlarged is defined as a first direction D1, and the direction in which the mobile terminal contracts or retracts or is reduced to switch from the second state to the first state is defined as a second direction D2. A direction perpendicular to the first and second directions D1 and D2 is defined as a third direction.

The mobile terminal 100 of the present disclosure may switch from a first state, in which the display unit 151 is arranged on the front of the mobile terminal having a bar shape as shown in FIG. 3(a), to a second state by extending the screen as shown in FIG. 3(b). In the second state, the area of the front portion of the display unit 151 is increased and the area of the rear portion of the display unit 151 is reduced as shown in FIG. 4(b). That is, the display unit 151 positioned on the back of the mobile terminal 151 in the first state moves to the front of the mobile terminal 100 upon switching to the second state.

In this way, a flexible display unit 151 which is bent may be used as the display unit such that the position of the display unit may be varied. The flexible display means a display, which is manufactured on a thin and flexible substrate capable of being curved, bent, folded, twisted or rolled like a paper, lightweight and robust not to be easily broken while maintaining characteristics of the existing flat panel display.

Also, an electronic paper is based on a display technique to which a feature of a general ink is applied, and is different from the existing flat panel display in that it uses reflective light. The electronic paper may change information by using electrophoresis that uses a twist ball or capsule.

In a state that the flexible display unit 151 is not deformed (for example, the state that the flexible display unit 151 has an infinite curvature radius, hereinafter, referred to as base state), a display area of the flexible display unit 151 becomes a plane. In a state (for example, the state having a finite curvature radius, hereinafter, referred to as a deformation state) deformed by an external force from the base state, the display area may be a curved surface. As shown, information displayed in the deformation state may be visual information output to the curved surface. This visual information is implemented as luminescence of unit sub-pixels arranged in a matrix arrangement is controlled independently. The unit sub-pixel means a minimum unit for implementing one color.

The flexible display unit 151 may be arranged in a bent state (for example, the state bent in a vertical or horizontal direction) not a flat state in the base state. In this case, if an external force is applied to the flexible display unit 151, the flexible display unit 151 may be deformed in a flat state (or less bent state) or a more bent state.

Meanwhile, the flexible display unit 151 may implement a flexible touch screen in combination with a touch sensor. If a touch is performed for a flexible touch screen, the controller 180 (see FIG. 1) may perform a control corresponding to such a touch input. The flexible touch screen may be configured to sense a touch input even in the deformation state as well as the base state.

The touch sensor senses a touch (or touch input) applied to the touch screen by using at least one of various touch modes such as a resistive film mode, a capacitance mode, an infrared mode, an ultrasonic mode, and a magnetic field mode.

As an example, the touch sensor may be configured to convert a change of a pressure applied to a specific portion of the touch screen or a change of capacitance occurring in the specific portion to an electric input signal. The touch sensor may be configured to allow a touch target, which performs a touch on the touch screen, to detect a touch position, a touch area, a touch pressure and touch capacitance on the touch sensor.

The mobile terminal 100 may be provided with a deformation detection means configured to detect deformation of the flexible display unit 151. Such deformation detection means may be included in the sensing unit 140 (see FIG. 1).

The deformation detection means may be provided in the flexible display unit 151 or a case (first to third frame 101 to 103, which will described later) to detect information related to deformation of the flexible display unit 151. Here, the information related to the deformation may include a direction in which the flexible display unit 151 is deformed, a degree of deformation, a deformed position, a deformation time, and an acceleration at which the flexible display unit 151 returns from the deformed position to the original position. The information may further include various kinds of information that may be detected according to bending of the flexible display unit 151.

Also, the controller 180 may modify information displayed on the flexible display unit 151 or generate a control signal for controlling functions of the mobile terminal 100, on the basis of the information related to deformation of the flexible display unit 151 sensed by the deformation sensing means.

Switching of the flexible display unit 151 to a state (the first or second state), that is, change in size of the display unit 151 on the front and back of the mobile terminal 100 according to change in size of the mobile terminal 100 may be performed manually by the force exerted by the user, but is not limited to this manual operation. For example, the mobile terminal 100 or the flexible display unit 151 in the first state may be deformed to switch to the second state by a command from a user or an application without external force applied by the user. In order to automatically deform the flexible display unit 151 without external force, the mobile terminal 100 may include a drive unit 200, which will be described later.

The flexible display unit 151 of the present disclosure is bent 180 degrees by rolling around one of both side portions of the mobile terminal 100. Therefore, a part of the display unit 151 is disposed on the front of the mobile terminal 100 with respect to such a side portion, and the other part is disposed on the back of the mobile terminal 100. A part of the display unit 151 positioned on the front of the mobile terminal 100 may be immovably fixed on the front, and the other part thereof positioned on the back of the mobile terminal 100 may be movably arranged on the back.

In addition, the display unit 151 may be rolled or unrolled around the side portion, thereby moving a part thereof disposed on the back of the mobile terminal 100 to adjust the size of the region thereof disposed on the front of the mobile terminal 100. The flexible display unit 151 has a predetermined area and consists of one continuous body. Accordingly, as the area of the front portion of the flexible display unit 151 increases, the area of the rear portion of the flexible display unit 151 decreases. The display unit 151 configured as described above may be rolled in a second frame 102, which is movable with respect to a first frame 101, more specifically, around one side portion of the second frame 102, which will be described later. The display unit 151 may be withdrawn or pulled out or from the second frame 102 or inserted or pushed thereinto while being rolled around the second frame 102 according to movement of the second frame 102 to adjust the area of the display unit 151 on the front of the mobile terminal 100. This operation will described in more detail below in connection with the other related components of the mobile terminal 100.

Typically, an antenna is provided in the case or housing of the mobile terminal 100. However, a position where the antenna may be installed in the case or housing may be limited by the flexible display unit 151, which covers the front and back of the mobile terminal 100. For this reason, an antenna may be implemented on the flexible display unit 151. The antenna on display (AOD) is an antenna of a transparent film formed by laminating a patterned electrode layer and a dielectric layer. The AOD may be implemented to be thinner than when implemented with the conventional laser direct structuring (LDS) technique, which is implemented with copper nickel plating. Accordingly, the AOD may neither affect the thickness nor be exposed to the outside. In addition, with the AOD, the display unit 151 may directly transmit and receive signals. Therefore, the mobile terminal 100 provided with the display unit 151 on both sides as in the present disclosure may employ an AOD.

Hereinafter, configuration of the mobile terminal 100 of the present disclosure will described in detail with reference to FIGS. 2 to 5. In the following description, reference is made primarily to FIG. 2, which shows the overall configuration of the mobile terminal 100, and the detailed features of the corresponding components in the first and second states of the mobile terminal 100 will be described with reference to FIGS. 3 to 5.

The mobile terminal 100 of the present disclosure may include a main frame on which components are mounted. The size of the main frame of the present disclosure may vary in the first direction as shown in FIG. 2. At least one frame may make a relative movement and the size thereof may vary in the first direction. Electronic components are mounted inside the main frame, and the flexible display unit 151 is disposed outside of the main frame.

As the mobile terminal 100 of the present disclosure includes the flexible display unit, the flexible display unit 151 may be coupled thereto in a manner of surrounding the front and rear surfaces of the main frame. The main frame may include first to third frames. The main frame may include a first frame 101, a second frame 102 movable in the first direction with respect to the first frame 101, and a third frame 103 movable in the first direction with respect to the second frame 102. The first frame 101 and the second frame 102 may each include a front portion, a rear portion and a side portion, and may be coupled to each other. Thus, the first and second frames 101 and 102 coupled to each other may define the appearance of the mobile terminal 100, which has a hexahedral shape. According to the configuration of the first to third frames 101 to 103, the second and third frames 102 and 103 may make a slide movement.

The first frame 101 may correspond to the main body of the mobile terminal 100 and define a space therein to accommodate various components. In addition, the first frame 101 may accommodate, in the defined space, the second frame 102 movably coupled to the first frame 101. More specifically, the first frame 101 may include a first front portion 1011 disposed on the front of the mobile terminal 100, and a first rear portion 1012 and a second rear portion 1013 disposed on the rear side of the mobile terminal 100, as well shown in FIGS. 2 and 5.

The first front portion 1011, the first rear portion 1012, and the second rear portion 1013 may be formed of a substantially flat plate member. The first rear portion 1012 and the second rear portion 1013 may be formed of separate members coupled to each other or may be formed of one member as shown in the figures. The first front portion 1011 and the first rear portion 1012/second rear portion 1013 may be spaced apart from each other by a predetermined distance and be connected to each other by a side portion 1014. The controller 180 and the power supply unit 190, which are components of the mobile terminal 100, may be accommodated in the space in the first frame 101. For example, the controller 180 may be a circuit board including a processor and an electronic circuit configured to control the operation of the mobile terminal, and the power supply unit 190 may include a battery and related components. The second frame 102 and the drive unit 200, which will be described later, may also be accommodated in the first frame 101.

As described above, the display unit 151 may have a continuous body and may be disposed on both the front and back of the mobile terminal 100 while being rolled in the mobile terminal 100. The display unit 151 may include a front portion positioned on the front of the mobile terminal 100, a rear portion positioned on the back of the mobile terminal 100, and a lateral side portion positioned between the front portion and the rear portion to surround the lateral side of the mobile terminal. The front portion and the rear portion may be flat, and the lateral side portion may form a curved surface. The flexible display unit 151 is likely to be broken when it is bent. Thus, the flexible display unit 151 may be configured to be bent with a predetermined curvature.

The display unit 151 may be divided into a fixed part and a variable part. The fixed part means a part fixed to the frame. Since it is fixed to the frame, the fixed part maintains a constant shape with a bending degree thereof unchanged. On the other hand, the variable part means a part in which the bending angle of the bent portion is variable or the position of the bent portion is changed. The variable part having a variable bending position or angle requires a structure to support the rear surface of the variable part according to the change.

A first region of the display unit 151 may be coupled to the first front portion 1011, which corresponds to the front of the mobile terminal 100.

As shown in FIG. 4, the physical input unit 120 and the sensing unit 140, which are configured for operation of the mobile terminal 100, may be arranged in the first rear portion 1012. The display unit 151 may be disposed only on the second rear portion 1013. The first rear portion 1012 may remain exposed to the outside without overlapping the flexible display unit 151 regardless of the state of the mobile terminal. Accordingly, the input unit 120, which may include various buttons, switches, the camera 121, and a flash, and the sensing unit 140, which may include the proximity sensor 141, may be disposed on the first rear portion 1012. For a typical bar-type terminal, the display unit is arranged only on the front of the terminal. Therefore, a main camera is disposed on the back of the terminal to allow a user to photograph an object on the opposite side while viewing the object through the display unit. In addition, an auxiliary camera is required to be arranged on the front of the terminal in order for the user to photograph himself while viewing his image through the display unit.

However, for the mobile terminal 100 of the present disclosure, the display unit 151 is arranged on both the front and back of the mobile terminal 100. Accordingly, in photographing the user himself, a portion of the display unit 151 on the same surface as the camera 121, that is, the display unit 151 on the back of the mobile terminal 100 in the figure may be used. In photographing an object on the side opposing to the user, a portion of the display unit 151 on the opposite side of the camera 121, that is, the display unit 151 on the front of the mobile terminal 100 in the figure may be used. For this reason, the mobile terminal 100 may photograph an object located on the opposite side of the user or the user himself using one camera 121. The camera may include a plurality of cameras having different angles of view, such as wide angle, ultra wide angle, and telephoto angle. Not only the camera but also a proximity sensor and a sound output unit may be positioned on the first rear portion 1012, and an antenna 116 may be installed on the first rear portion 1012.

The side portion 1014 may extend along the edges of the first front portion 1011, the first rear portion 1012, and the second rear portion 1013 to surround the circumference of the first frame 101 and may define the appearance of the mobile terminal 100. However, as mentioned above, the second frame 102 is accommodated in and movably coupled to the first frame 101, and therefore a portion of the first frame 101 needs to be open to allow movement of the second frame 102 relative to the first frame 101. As an example, as best shown in FIG. 2, the second frame 102 may be movably coupled to one of both side portions of the first frame 101, and accordingly the side portion 1014 is not formed on the side portions. Accordingly, the first frame 101 may include a first side portion 101a, which is substantially closed, and a second side portion 101b, which is disposed to face away from the first side portion 101a so as to be open. Since the side portion 1014 is exposed to the outside of the mobile terminal 100, the interface unit 160 for connecting a power port or an ear jack or the user input unit 120, such as a volume button, may be disposed on the side portion 1014. When the side portion 1014 contains a metal material, the side portion 1014 may serve as an antenna.

The second rear portion 1013 of the first frame 101 may be covered by the display unit, or may be disposed on the front of the display unit using a transparent material.

The second frame 102 may include a second front portion 1021 disposed on the front side of the mobile terminal 100 and a third rear portion 1022 disposed on the rear side of the mobile terminal 100. Like the first front portion 1011 and the first rear portion 1012 of the first frame 101, the second front portion 1021 and the third rear portion 1023 may be formed of a substantially flat plate member. In addition, the second frame 102 accommodates various components and should not interfere with the components accommodated in the first frame 101 during movement. Accordingly, the second front portion 1021 and the third rear portion 1022 may be coupled to each other with a predetermined space formed therebetween, and may have a shape that does not interfere with the components in the first frame 101.

The display unit 151 may be bent 180 degrees by being rolled in the second frame 102 so as to be disposed on both the front and back of the mobile terminal 100. To implement such an arrangement of the display unit 151, the second frame 102 may include a roller 1028 rotatably disposed therein. The roller 1028 may be disposed at any position inside the second frame 102. However, the display unit 151 should be spread flat on the front and back of the mobile terminal 100 in order to provide a good quality screen to the user. Tom implement such spreading, appropriate tensional force should be applied to the display unit 151. In order to apply appropriate tensional force, the roller 1028 may be disposed at an end of the second frame 102 facing in the first direction. The roller 1028 may extends in the second direction and be rotatably coupled to the second frame 102.

The display unit 151 may be rolled around the roller 1028 while being gently curved at a predetermined curvature. The flexible display unit 151 may include a first surface configured to output an image and exposed to the outside and an inner surface arranged on the opposite side to face the frame. The roller 1028 may be arranged to freely rotate on the second frame 102 while contacting the inner surface of the display unit 151. Accordingly, the roller 1028 may substantially move the display unit 151 in a lateral direction of the mobile terminal 100, namely, a direction perpendicular to the longitudinal direction. As will be described later, when the second frame 102 slides, the display unit 151 may be moved with respect to the second frame 102 in different directions (i.e., the first direction D1 or the second direction D2) toward the front or back of the mobile terminal 100 by the tensional force applied by the second frame 102. Such a movement may be guided by rotation of the roller 1028.

Further, the roller 1028 is disposed on a first side portion 102a of the second frame 102. The first side portion 102a may substantially correspond to the outermost side portion of the mobile terminal 100. If the first side portion 102a of the second flame 102 is exposed, the display unit 151 rolled around the roller 1028 may be damaged. Accordingly, the second frame 102 may include a side frame 1024 disposed on the first side portion 102a.

The side frame 1024 may extend in the longitudinal direction of the second frame 102 to cover the first side portion 102a, thereby protecting the roller 1028 and the display unit 151 rolled therearound. That is, the side frame 1024 covers the lateral side portion of the display unit 151. The lateral side portion is disposed in a third region. The first to third regions are at designated positions on the flexible display unit and the sizes or positions thereof do not change. On the other hand, the sizes of the front and rear portions and the position of the lateral side portion are determined according to the state of the main frame.

The first region and the second region may correspond to the fixed part described above. The third region may correspond to the variable part described above and the position thereof may vary depending on the state of the mobile terminal.

Since the lateral side portion is rolled by the roller, the lateral side portion may be curved at a predetermined curvature, and the inner side surface of the side frame may include a curved surface corresponding to the curvature of the lateral side portion.

The first side portion 102a of the second frame 102 may be substantially closed by the side frame 1024. The side frame 1024 may substantially define the appearance of the mobile terminal 100 in cooperation with the side portion 1014 of the first frame 101. In addition, the second frame 102 may include a second side portion 102b that is open and disposed to face the first side portion 102a to minimize interference with the components arranged in the first frame 101 during movement.

The second frame 102 may be movably coupled to the first frame 101, and may thus be configured to slide in the predetermined first or second direction D1 or D2 with respect to the first frame 101. More specifically, as shown in the figure, the second frame 102 may be movably coupled to the first frame 101 via the side portion of the first frame 101, more specifically, the second side portion 101b that is open. More specifically, the second side portion 102b of the second frame may be disposed relatively adjacent to the first side portion 101a of the first frame 101, which is a closed portion, and thus the first side portion 102a of the second frame may be disposed to face the first side portion 101a. Thus, the second side portion 102b is inserted into the first frame 101 through the side portion of the first frame, namely, the second side portion 101b. The first side portion 102b may remain outside the first frame 101 without being inserted into the first frame 101, thereby defining the appearance of the mobile terminal 100 as described above. However, when necessary, the first side portion 102b of the second frame 102 may also be inserted into the first frame 101.

Due to such a positional relationship, the second frame 102 may extend or retract from or to the first frame 101 in a direction perpendicular to the longitudinal direction of the mobile terminal 100 or the first frame 101. That is, the first and second directions D1 and D2 may be perpendicular to the longitudinal direction of the mobile terminal 100 or the first frame 101. In other words, the first and second directions D1 and D2 may be the lateral direction or horizontal direction of the mobile terminal 100 or the first frame 101. In addition, in the movement in the first direction D1, the second frame 102 may extend from the first frame 101. Thus, the first direction D1 may be a direction in which the second frame 102 moves away from the first frame 101, namely, outwardly of the mobile terminal 100 or the first frame 101. In the movement in the second direction D2, the second frame 102 retracts into the first frame 101. Accordingly, the second direction D2 may be a direction opposite to the first direction D1, and the second frame 102 may move closer to the first frame 101, that is, inwardly of the mobile terminal 100 or the first frame 101 in the second direction D2. When the second frame 102 is moved in the first direction D1, the second frame 102 may be extended to apply force to a part of the display unit 151 disposed on the back of the mobile terminal 100 such that the display unit 151 is further disposed on the front of the mobile terminal 100, and a region for such disposition may be formed. Accordingly, when moved in the first direction D1, the second frame 102 may switch the mobile terminal 100 to the second state in which the display unit 151 has a relatively extended front. On the other hand, when moved in the second direction D2, the second frame 102 may retract to the original position and apply force to a part of the display unit 151 disposed on the front of the mobile terminal 100 such that the display unit 151 returns to the back of the mobile terminal 100. Accordingly, when moved in the second direction D2, the second frame 102 may switch the mobile terminal 100 to the first state in which the display unit 151 has a relatively reduced front. Accordingly, the second frame 102 may selectively expose the display unit 151 on the front of the mobile terminal 100 according to the movement direction (i.e., the first or second direction D1 or D2), thereby switching the mobile terminal 100 to the first or second state as defined above.

During the extension and retraction in the first and second directions D1 and D2, the second frame 102 may overlap the first frame 101, more specifically, the first front portion 1011 and the first rear portion 1012 thereof so as not to interfere with the first frame 101. More specifically, as described above, the display unit 151 may be coupled to and supported by the first front portion 1011 of the first frame 101, and accordingly does not need to be additionally supported by the second front portion 1021 of the second frame 102. However, when the second front portion 1021 is interposed between the first front portion 1011 and the display unit 151, the display unit 151 may be deformed or broken due to friction against the second front portion 1021, which repeatedly moves. Thus, the second front portion 1021 may be disposed below the first front portion 1011, as shown in FIG. 5. That is, the front surface of the second front portion 1021 may face the rear surface of the first front portion 1011. In addition, the rear surface of the first front portion 1011 may contact the front surface of the second front portion 1021 in order to stably support the movement of the second frame 102.

The third rear portion 1022 of the second frame 102 may be disposed below the second rear portion 1013 of the first frame 101. That is, the front surface of the third rear portion 1022 may face the rear surface of the second rear portion 1013. In addition, the rear surface of the second rear portion 1013 may contact the front surface of the third rear portion 1022 to stably support the movement of the second frame 102. By this arrangement, the third rear portion 1022 may be exposed to the outside of the first frame, specifically, the second rear portion 1013, and may be coupled to the display unit 151.

Alternatively, when the second rear portion 1013 is made of a transparent material, the second rear portion 1013 may define the rear appearance of the mobile terminal. The second rear portion 1013 may be arranged farther to the rear side than the third rear portion 1022 of the second frame. In the first state, the flexible display unit may be positioned between the second rear portion 1013 and the third rear portion 1022.

When the second rear portion 1013 is formed of a material such as transparent glass to define the rear appearance of the mobile terminal, the first rear portion 1012 may be implemented with the same member as the second rear portion 1013. That is, the camera 121, the flash or the sensing unit 140 may be disposed by partially coating the transparent glass plate member such that internal components are not visible and coating is not applied to necessary parts.

In addition, the second frame 102 may extend and retract in the first and second directions D1 and D2 to increase or reduce the size of the mobile terminal 100, in particular, the front of the mobile terminal 100. The display unit 151 is required to move as far as the extension or reduction of the front to obtain the first or second state as intended. However, when fixed to the second frame 102, the display unit 151 may not be smoothly moved according to the extension or reduction of the front of the mobile terminal 100. For this reason, the display unit 151 may be movably coupled to the second frame 102. More specifically, the display unit 151 may include a first end (a side edge or side end) 151d disposed on the front of the mobile terminal 100 and a second end 151e opposing the first end and disposed on the back of the mobile terminal 100. The first end 151d may be disposed on the front surface of the first frame 101, that is, the front surface of the first front portion 1011 thereof, and arranged adjacent to the side portion of the mobile terminal 100, that is, the first side portion 101a of the first frame. On the other hand, the second end 151e is adjacent to the back of the mobile terminal 100, i.e., the third rear portion 1022 of the second frame 102, and accordingly may be coupled to the third rear portion 1022 of the second frame 102 so as to move in the first and second directions D1 and D2. In addition, since the display unit 151 is not structurally strong, the third frame 103 may be coupled to the second end 151e. The third frame 103 may be formed of a plate member extending in the longitudinal direction of the mobile terminal 100. Accordingly, in place of the second end 151e, the third frame 103 may be coupled to the second frame, that is, the third rear portion 1022 thereof, so as to move in the first and second directions D1 and D2. The second frame 102 may include a slot 1025 extending in the lateral direction of the mobile terminal 100 or the second frame 102, that is, the direction perpendicular to the longitudinal direction thereof. The third frame 103 may be guided by the slot 1025 to stably move. The third frame 103 may include, for example, a protrusion inserted into the slot 1025 for movement along the slot 1025.

Referring to FIGS. 3 to 5, in relation to the configuration of the first to third frames 101, 102, and 103, the display unit 151 may include a first region 1511 extending from one side thereof, that is, the first end 151d by a predetermined length toward the second end 151e opposite to the first end 151d, and a second region 1512 arranged to face the first region 1511 and extending from the second end 151e by a predetermined length toward the first end 151d. The display unit 151 may further include a third region 1513 disposed between the first and second regions 1511 and 1512. The first to third regions 1511, 1512, and 1513 may be connected to each other to form a continuous body of the display unit 151. In addition, as described above, in order to allow the third region 1513 to move to the front or back of the mobile terminal 100 according to movement of the second frame 102, the first region 1511 may be immovably fixed to the front of the mobile terminal 100 and the second region 1512 may be movably arranged on the back of the mobile terminal 100. The display unit 151 configured as described above will be described in more detail below.

The first region 1511 may be disposed on the front surface of the mobile terminal 100, more specifically, the first frame 101, that is, the front surface of the first front portion 1011. The first region 1511 may be fixed to the front surface of the first frame 101, that is, the first front portion 1011 such that the first region 1511 does not move when the second frame 102 is moved. Thus, the first region 1511 may be constantly exposed on the front of the mobile terminal 100. The third region 1513 may be adjacent to the first region 1511 and may be extended into the second frame 102 and rolled around the roller 1028. The third region 1513 may continuously extend out of the second frame 102 to partially cover the second frame 102, that is, the rear surface of the third rear portion 1022. Since the second frame 102, that is, the third rear portion 1022, is arranged adjacent to the first frame 101, that is, the second rear portion 1013 to form the rear case of the mobile terminal 100 in conjunction therewith, the third region 1513 may be disposed on the rear surface of the first frame 101.

The second region 1512 may be adjacent to the third region 1513 and disposed on the back of the mobile terminal 100, more specifically, the rear surface of the second frame, i.e., the third rear portion 1022 thereof. The second region 1512 may be coupled to the third frame 103 rather than being coupled directly to the second frame 102. As shown in FIG. 4(b), a slot 1025 extending in a lateral direction (i.e., a direction perpendicular to the longitudinal direction of the mobile terminal 100) may be formed in the second frame 102, that is, the third rear portion 1022, such that the third frame 103 may move along the slot 1025. While it is illustrated in FIG. 4(b) that the slot 1025 is formed in the rear surface of the second frame 102, it may be formed in the lateral side surface of the second frame 102. The second region 1512 may move together with the third frame 103 in the first or second direction D1 or D2 with respect to the second frame 102, but the slot 1025 may limit the movement of the second region 1512 such that the movement take place within the rear surface of the mobile terminal 100. That is, the second region 1512 may not move beyond the second frame 102 when the second frame 102 extends or retracts. The second region 1512 may move a distance of extension or retraction of the second frame 102 along the slot 1025 within the second frame 102. Therefore, the second region 1512 may be constantly exposed on the back of the mobile terminal 100.

As a result, the first region 1511 may be disposed on the front of the mobile terminal 100 to remain exposed on the front regardless of the movement of the second frame 102, and the second region 1512 may be disposed on the back of the mobile terminal 100 to remain exposed on the back regardless of the movement of the second frame 102. In addition, the third region 1513 may be arranged between the first and second regions 1511 and 1512 so as to be selectively disposed on the front or back of the mobile terminal 100 according to the movement direction D1, D2 of the second frame 102.

Due to the selective disposition of the third region 1513, as shown in FIG. 4(b), the second rear portion 1013 of the first frame 101 may be covered by the second and third regions 1512 and 1513 of the display unit 151 and the third rear portion 1022 in the first state, and may be exposed to the outside of the mobile terminal 100 in the second state because the third region 1513 moves to the front of the mobile terminal 100 and the third rear portion 1022 moves in the first direction D1. In addition, the second front portion 1021 of the second frame 102 may be disposed below the first front portion 1011 of the first frame 101 in the first state, but may move out of the first frame 101 in the second state to support the third region 1513 of the display unit 151 disposed on the front of the mobile terminal 100.

Since the first and second regions 1511 and 1512 are constantly disposed on the front and back of the mobile terminal 100, the first region 1511 and the second region 1512 may have a constant curvature and remain flat. However, the third region 1513 may be bent by being rolled around the roller 1028 in the second frame 102. In switching from the first state to the second state, the third region 1513 may extend from the second frame 102 to the front of the mobile terminal 100 while being rolled around the roller 1028 in one direction. On the other hand, in switching from the second state to the first state, the third region 1513 may retract from the front of the mobile terminal 100 into the second frame 102 while being rolled around the roller 1028 in the opposite direction. Thereby, the third region 1513 may return from the second frame 102 to the back of the mobile terminal 100. A foldable mobile terminal that is unfoldable like a book is likely to be broken at a specific position thereon because it is repeatedly folded only at the specific position. On the other hand, a deformed portion of the flexible display unit 151, that is, a portion rolled around the roller 1028, may vary according to the first and second states of the mobile terminal 100, that is, movement of the second frame 102. Therefore, the mobile terminal 100 of the present disclosure may significantly reduce deformation and fatigue repeatedly applied to a specific portion of the display unit 151, thereby preventing damage to the display unit 151.

Hereinafter, the overall operation of the mobile terminal 100 will be described based on the configuration described above. As an example, the state switching may be performed manually by a user. The operation of the mobile terminal 100 in the manual state switching is described below. However, the operation of the first to third frames 101 to 103 and the display unit 151 described below may be performed in the same manner even when a power source other than the force of the user, for example a drive unit 200, is employed.

As shown in FIGS. 3(a), 4(a) and 5(a), in the first state, the second frame 102 is fully retracted into the first frame 101. Therefore, only the first region 1511 of the display unit 151 fixed to the front of the first frame 101 may be exposed on the front of the mobile terminal 100. The first region 1511 may be fixed to and supported by the first frame 101, that is, the first front portion 1011 thereof. In addition, most of the third region 1513 may be disposed on the back of the mobile terminal 100 together with the second region 1512, and may be disposed in the second frame 102 with a part thereof rolled around the roller 1028. The third region 1513 on the back of the mobile terminal 100 may be supported by the second frame, that is, the third rear portion 1022 thereof. The second region 1512 may be fixed by the third frame 103 disposed on the second frame (i.e., the third rear portion 1022), and may be movably coupled to the second frame 102.

In this first state, when the second frame 102 moves in the first direction D1, the mobile terminal 100 may be switched to the second state. As shown in FIGS. 3(b), 4(b) and 5(b), the second frame 102 may extend from the first frame 101 by moving in the first direction D1. In this case, the overall size of the mobile terminal 100, particularly, the front thereof may be increased. During the movement in the first direction D1, the second frame 102 may apply force, specifically, tensional force, to the display unit 151 in the first direction D1. The display unit 151 is fixed to the first frame 101 but is movably coupled to the second frame 102 through the third frame 103. Accordingly, the third region 1513 may be rolled out from the roller 1028 of the second frame 102 to the front of the mobile terminal 100 by the force applied by the second frame 102. That is, the third region 1513 may be withdrawn or pulled out, extended, or moved out from the second frame 102. At the same time, the third region 1513, in particular, a portion thereof disposed on the back of the mobile terminal 100, may be rolled into the roller 1028 of the second frame 102 from the back or the second frame 102 or be inserted or pushed, retracted, or moved into the second frame 102. Not all the third region 1513 may be withdrawn from the second frame 102 to the front of the mobile terminal 100, and a part of the third region 1513 may still remain rolled around the roller 1028 and disposed within the second frame 102. To allow the third region 1513 to smoothly move, the second region 1512 may move together with the third frame 103 in the first direction D1 with respect to the second frame 102.

As described above, the second region 1512 and the third frame 103 may be constrained by the second frame 102 and may thus move together with the second frame 102 in the first direction D1 with respect to the first frame 101. Accordingly, the second region 1512 and the third frame 103 may move in the first direction D1 with respect to the first frame 101 as well as the second frame 102. Thereby, they move a distance longer than the movement distance of the second frame 102. Therefore, due to the long-distance movement of the second region 1512 in the first direction D1, the third region 1513 may smoothly extend to the front of the mobile terminal 100. In addition, in order to move the third region 1513 in proportion to extension of the second frame 102, the movement of the second region 1512 and the third frame 103 in the first direction D1 and the movement of the third region 1513 and the second frame 102 in the first direction D1 may be performed at the same time such that the movement of the second region 1512 and the third frame 103 is proportional to the movement of the third region 1513 and the second frame 102.

When the second frame 102 is fully extended in the first direction D1, the first and third regions 1511 and 1513 may be disposed on the front of the mobile terminal 100, and only the second region 1512 may be disposed on the back of the substrate. The first and third regions 1511 and 1513 may be supported by the first frame (i.e., the first front portion 1011 thereof) and the second frame (i.e., the second front portion 1021 thereof). In addition, while extending in the first direction D1, the second frame 102, that is, the third rear portion 1022 thereof may expose the second rear portion 1013 of the first frame and support the third region 1513 that is moving. Therefore, in the second state, the display unit 151 of the mobile terminal 100 may have an extended front surface.

On the other hand, when the second frame 102 in the second state moves in the second direction D2, the mobile terminal 100 may return to the first state as shown in FIGS. 3(*a*), 4(*a*) and 5(*a*). The second frame 102 may retract to the first frame 101 by moving in the second direction D2. Thereby, the overall size of the mobile terminal 100, in particular, the front thereof may be reduced. The movement of the display unit 151 during the movement of the second frame 102 may be performed in a reverse order of the movement in the first direction D1 described above. In brief, the third region 1513 may be rolled into the roller 1028 of the second frame 102 from the front of the mobile terminal 100 or may be inserted, retracted, or moved into the second frame 102. At the same time, the third region 1513 may be rolled out, withdrawn out, extended or moved from the roller 1028 of the second frame 102 to the back of the mobile terminal 100. Not all the third region 1513 may be withdrawn out from the second frame 102 to the back of the mobile terminal 100, and a part of the third region 1513 may be rolled around the roller 1028 and disposed within the second frame 102. In addition, in order to allow the third region 1513 to smoothly move, the second region 1512 may move together with the third frame 103 in the second direction D2 with respect to the second frame 102. The second region 1512 and the third frame 103 may be constrained by the second frame 102 and may thus move together with the second frame 102 in the second direction D2 with respect to the first frame 101. Therefore, the second region 1512 and the third frame 103 may move in the second direction D2 with respect to the first frame 101 as well as the second frame 102. Thus, they may move a distance longer than the movement distance of the second frame 102 in the second direction D2. Therefore, due to the long-distance movement of the second region 1512, the third region 1513 may smoothly return to the back of the mobile terminal 100. In addition, in order to move the third region 1513 in proportion to the retraction of the second frame 102, the movement of the second region 1512 and the third frame 103 in the first direction D1 and the movement of the region 1513 and the second frame 102 in the first direction D1 may be performed at the same time such that the movement of the second region 1512 and the third frame 103 is proportional to the movement of the region 1513 and the second frame 102. Once the second frame 102 is fully retracted in the second direction D2, the mobile terminal 100 may switch to the first state as described above. In the first state, the display unit 151 may have a reduced front surface compared to the front surface in the second state.

One surface of the flexible display unit 151 may output an image and be exposed to the outside, and the opposite surface thereof may be coupled to a frame supporting the flexible display unit 151.

The first region of the flexible display unit 151 is supported by the first frame 101 and the second region is supported by the third frame 103. However, the third region is not directly coupled to any of the first to third frames 101, 102, and 103, which constitute the body of the mobile terminal. Since the curvature at a bending position or bending deformation of the third region, that is, the variable part is variable, a display frame that has a curvature variable according to the curvature of the third region is needed.

FIG. 6 is a perspective view showing a side portion 1027 of the embodiment according to presence of the side portion 1027 of the second frame 102. FIG. 6(*a*) illustrates an exemplary case where there is not the side portion 1027 positioned at the end of the second frame 102 facing in the third direction, and FIG. 6(*b*) illustrates an exemplary case where the side portion 1027 is present. When the second frame 102 is extended, the second frame 102 may move from a position inside the first frame 101 in the third direction, and the inside of the second frame 102 may be exposed as shown in FIG. 6(*a*). Foreign matter introduced into the exposed portion may affect the durability of the mobile terminal 100. Accordingly, as shown in FIG. 6(*b*), the second frame 102 may be provided with the side portion 1027 at the end thereof facing in the third direction to cover the extended space.

In addition, the extended portion of the display unit 151 may sag because there is no structure to support the back of the display unit 151. In addition, the display unit 151 may be separated from the frames 101 and 102. In particular, the separation may occur more easily when the display unit switches from the second state to the first state. Therefore, a structure to keep the display unit 151 flat when the third region of the display unit 151 moves to the front is required.

Figure 7:
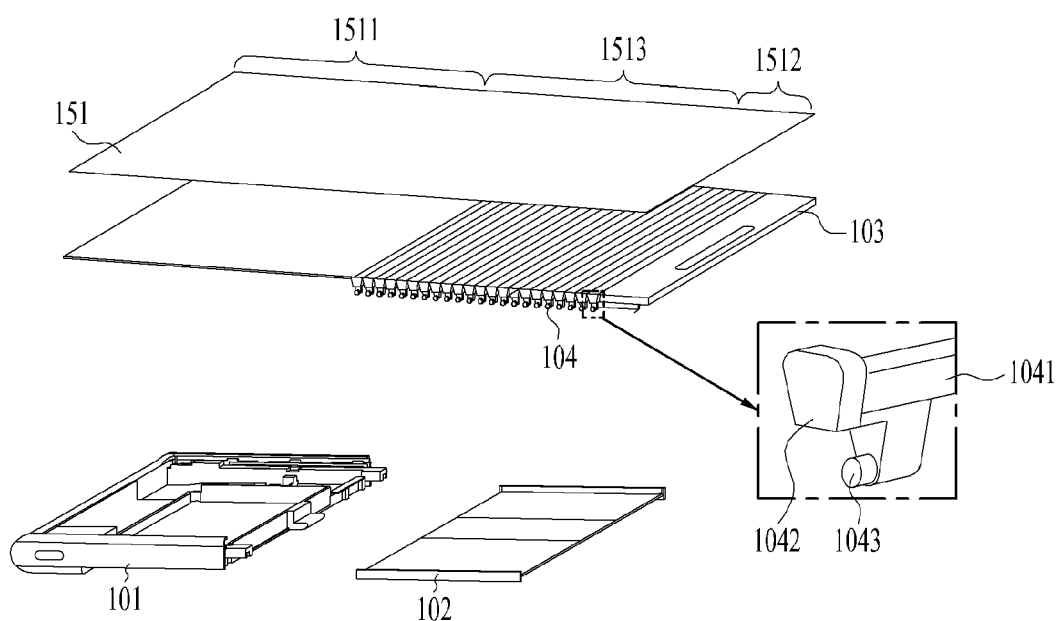
FIG. 7 is an exploded perspective view of the mobile terminal of the present disclosure.

FIG. 7 is an exploded perspective view of the mobile terminal 100 of the present disclosure, which may further include a display frame 104 in an area corresponding to the third region of the display unit 151. The display frame 104 may include a support bar 1041 extending in the third direction. A plurality of support bars 1041 may be arranged side by side in the first direction. The support bars 1041 may each be spaced apart from a neighboring support bar 1041 by a predetermined distance, and may be connected using a flexible material such as silicone.

Figure 8:
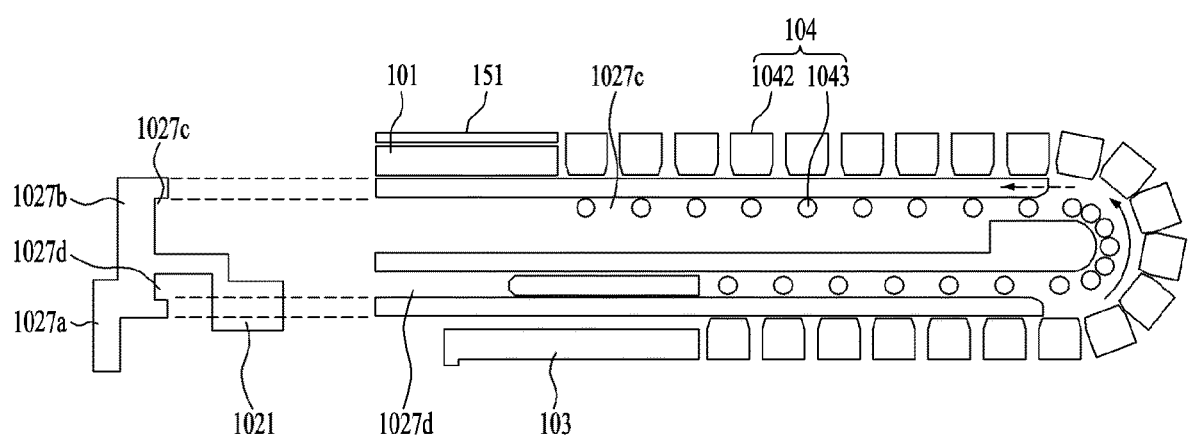
FIG. 8 is a view showing a display frame of a display unit.

FIG. 8 is a view showing a support frame of the display unit 151. The display frame 104 should be deflected in the first direction together with the display unit 151, and the inner side of the display frame 104 may have a narrower cross section than the outer side thereof in the thickness direction to ensure that the support bars 1041 do not interfere with each other when the display frame 104 is deflected.

The support bar 1041 may include an extended end 1042 extending beyond the length of the support bar 1041. The extended end 1042 may extend toward the display unit 151 to cover the lateral side of the display unit 151, and may also extend to the left and right to cover the space between the neighboring support bars 1041 to prevent the space from being exposed to the outside. The extended end 1042 may have a width decreasing from the front side thereof the rear side thereof so as not to interfere with the neighboring extended end 1042 at the bending position of the display unit 151.

The side portion 1027 of the second frame 102 may be supported at the end of the support bar 1041 facing in the third direction. Due to the rigidity of the support bar 1041, the support bar 1041 may remain flat without sagging in the middle thereof. The support bar 1041 may prevent the display unit 151 from sagging into the expanded empty space of the second frame 102, but the display unit 151 may be separated. In switching from the second state to the first state, the third region of the display unit 151 may not move rearward and may be separated from the second frame 102. In order to prevent the separation, a hook structure to fasten the support frame and the second frame 102 may be further provided.

FIG. 9 is a view taken along line C-C of FIG. 6. In FIG. 9, (a) and (b) disclose two different embodiments. Guide rails 1027c and 1027d extending in the first direction may be formed on the side portion 1027 of the second frame 102. A guide hook 1043 to be inserted into the guide rails 1027c and 1027d may be formed on the support bar 1041. Since the third region of the display unit 151 moves to the front and the back, the guide rails 1027c and 1027d may be symmetrically formed on the front and the back. The third rear portion 1022 of the second frame 102 may be disposed to support the third frame 103 and the display unit 151 positioned on the rear side and be arranged closed to the rear side of electronic components mounted therein. The guide rails 1027c and 1027d may be symmetrical with respect to the center in the thickness direction.

As illustrated in FIG. 9, the guide rails 1027c and 1027d may be formed on the inner lateral surface of the side portion 1027, and the guide hooks 1043 may protrude outward. Forming the guide hooks 1043 in the same plane as a portion of the support bar 1041 directly contacting the display unit 151 may increase the size of the bezel of the display unit 151. Accordingly, the guide hook 1043 may be formed on a portion of the support bar 1041 that protrudes in the thickness direction.

The side portion 1027 of the second frame 102 may include a rear side portion 1027a configured to cover the lateral surface of the display frame 104 positioned on the rear side and a front side portion 1027b extending forward from the rear side portion 1027a. When the mobile terminal 100 switches to the second state, the display unit 151 positioned on the rear side may be moved to the front side, and therefore the space where the display unit 151 is positioned on the back in the first state may become empty. That is, the rear side portion 1027a to cover the end of the display unit 151 is required to cover the space on the rear side from which the display frame 104 has moved.

The display frame 104 is moved from the back to the front as the mobile terminal 100 extends in the first direction. Accordingly, the front side portion 1027b may include an opening formed by removing a portion of the front side portion 1027b to expose the end of the support bar 1041 as shown in FIG. 6(*b*). The exposed end of the support bar 1041 and the front side portion 1027b may be arranged in the same plane, and the rear side portion 1027a covers the end of the support bar 1041. Accordingly, as shown in FIG. 9(*a*), the rear side portion 1027a may protrude from the front side portion 1027b and a step may be formed between the front side portion 1027b and the rear side portion 1027a.

The side portion 1027 of the first frame 101 may also have a step corresponding to the shape of the side portion 1027 of the second frame 102 having such a step. The thickness of the side portion 1014 of the first frame 101 may be increased by the depth of the front side portion 1027b, thereby securing the rigidity of the side portion 1014 of the first frame 101, which is positioned at the outermost side.

As shown in FIG. 9(*b*), the front side portion 1027b may be implemented to cover the end of the support bar 1041. In this case, when the mobile terminal 100 is extended, only the side portion 1027 of the second frame 102 may be exposed to the outside. Accordingly, a tidy appearance may be obtained.

The mobile terminal of the present disclosure may protect the interior of the mobile terminal by covering the lateral side of a portion extended when the mobile terminal is switched to the second state.

In addition, since the flexible display unit may be supported when extended, usability thereof in the extended state may be improved.

As a guide structure is provided, the display unit of the mobile terminal may remain flat without being separated or sagging from the frame even when is extended.

The above embodiments should be construed in all aspects as illustrative and not restrictive. The scope of the disclosure should be determined by the appended claims and their equivalents, and all changes coming within the meaning and equivalency range of the appended claims are intended to be embraced therein.

What is claimed is:
1. A mobile terminal comprising:
a first frame;
a second frame slidably coupled to the first frame and configured to:
  move with respect to the first frame in a first direction such that the mobile terminal is switched from a first state to a second state; and
  move with respect to the first frame in a second direction while the mobile terminal is in the second state such that the mobile terminal is switched to the first state, the second direction being opposite to the first direction;
a flexible display comprising:
  a first flat part coupled to a front side of the first frame;
  a variable part configured to curve around the second frame; and
a display frame coupled to a rear surface of the variable part of the flexible display,
wherein the second frame comprises:
  a side portion positioned at an end thereof facing in a third direction perpendicular to the first direction; and
  a guide rail formed on the side portion,
wherein the display frame comprises a plurality of guide hooks inserted into the guide rail.

2. The mobile terminal of claim 1, wherein:
the display frame further comprises a plurality of support bars extending in the third direction and arranged side by side in the first direction; and
the guide hooks are formed apart from the support bars in a thickness direction of the mobile terminal.

3. The mobile terminal of claim 2, wherein an end of each of the support bars is positioned outside an end of the guide hooks in the third direction.

4. The mobile terminal of claim 1, wherein the side portion of the second frame comprises:
a rear side portion;
a front side portion arranged in front of the rear side portion and
a side opening arranged in front of the front side portion and exposing an end of the display frame while the mobile terminal is in the second state.

5. The mobile terminal of claim 4, wherein the front side portion positioned deeper than the rear side portion protruding from the front side portion such that a step portion is formed between the front side portion and the rear side portion.

6. The mobile terminal of claim 4, wherein the end of the display frame and the front side portion form the same plane when the mobile terminal is in the second state.

7. The mobile terminal of claim 1, wherein:
the display frame further comprises a plurality of support bars extending in the third direction and arranged side by side in the first direction; and
an inner side of a cross section of each of the support bars is shorter than an outer side of the cross section.

8. The mobile terminal of claim 1, wherein the display frame further comprises:
a plurality of support bars extending in the third direction and arranged side by side in the first direction; and
extended ends extending from corresponding ends of each of the support bars to surround a side surface of the flexible display positioned in front of the support bars.

9. The mobile terminal of claim 8, wherein a spacing between neighboring extended ends is narrower than a spacing between corresponding neighboring support bars.

10. The mobile terminal of claim 8, wherein a size of the extended ends corresponds to a size of a side opening in the thickness direction of the mobile terminal.

11. The mobile terminal of claim 1, wherein:
the guide rail includes a front rail formed on a front side of the mobile terminal and a rear rail formed on a rear side of the mobile terminal, and
at least one of the guide hooks positioned at the rear rail moves to the front rail when the mobile terminal is switched from the first state to the second state.

12. The mobile terminal of claim 1, further comprising a third frame configured to move in the first direction or the second direction with respect to the second frame; and
wherein the display unit comprises a second flat part coupled to a rear side of the third frame.

* * * * *